United States Patent
Lee et al.

(10) Patent No.: US 8,358,183 B2
(45) Date of Patent: Jan. 22, 2013

(54) INTERMEDIATE FREQUENCY FILTER HAVING VARIABLE PASS BAND

(75) Inventors: Kyo Sang Lee, Gyunggi-do (KR); Eun Young Shin, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 470 days.

(21) Appl. No.: 12/622,381

(22) Filed: Nov. 19, 2009

(65) Prior Publication Data

US 2011/0074522 A1   Mar. 31, 2011

(30) Foreign Application Priority Data

Sep. 29, 2009  (KR) ............... 10-2009-0092689

(51) Int. Cl.
*H03H 7/00* (2006.01)
(52) U.S. Cl. ....................... 333/167; 333/174
(58) Field of Classification Search ............ 333/167, 333/174, 172, 185
See application file for complete search history.

(56) References Cited

U.S. PATENT DOCUMENTS

| | | | | |
|---|---|---|---|---|
| 3,325,738 A | * | 6/1967 | Busby et al. | 455/218 |
| 3,372,339 A | * | 3/1968 | Harrison et al. | 455/260 |
| 7,961,827 B2 | * | 6/2011 | Van Sinderen et al. | 375/350 |
| 2005/0040909 A1 | * | 2/2005 | Waight et al. | 333/17.1 |

* cited by examiner

*Primary Examiner* — Robert Pascal
*Assistant Examiner* — Kimberly Glenn
(74) *Attorney, Agent, or Firm* — Blakely Sokoloff Taylor & Zafman LLP

(57) ABSTRACT

Disclosed herein is an intermediate frequency filter having a variable pass band, which is capable of varying a pass band to minimize loss at a plurality of intermediate frequencies? The intermediate frequency (IF) includes a band pass filter unit arranged between a frequency conversion IC and a demodulation unit and configured to filter an IF signal output from the frequency conversion IC and output a resulting signal. A band varying unit is connected to the band pass filter unit and is configured to vary a pass band of the band pass filter unit. A switching unit connects or disconnects the band varying unit to or from the band pass filter unit. A control unit detects the IF signal and controls the switching unit in response to the IF signal so that the band varying unit is connected to or disconnected from the band pass filter unit.

8 Claims, 4 Drawing Sheets

US 8,358,183 B2

INTERMEDIATE FREQUENCY FILTER HAVING VARIABLE PASS BAND

CROSS REFERENCE TO RELATED APPLICATION

This application claims the benefit of Korean Patent Application No. 10-2009-0092689, filed on Sep. 29, 2009, entitled "Intermediate Frequency Filter Variable Band Pass", which is hereby incorporated by reference in its entirety into this application.

BACKGROUND OF THE INVENTION

1. Technical Field

The present invention relates to an intermediate frequency filter. More particularly, the present invention relates to an intermediate frequency filter having a variable pass band, which is capable of varying a pass band so as to minimize loss at a plurality of intermediate frequencies.

2. Description of the Related Art

Tuners are currently used in devices, such as radios or televisions, and more generally, in devices for processing modulated input signals which carry multimedia data. Such a tuner selects a data signal having a predetermined frequency from among Radio Frequency (RF) input signals, and converts the selected data signal into an Intermediate Frequency (IF) output signal so as to amplify and demodulate the data signal.

As shown in FIG. 1, in such a tuner, an RF signal received and input through an antenna is filtered to pass a desired band by a band pass filter 12 through a low-noise amplifier 11. A filtered band signal is amplified by an RF amplifier 13, and the amplified signal is filtered by a low pass filter 14. A signal filtered by the low pass filter 14 is converted into an Intermediate Frequency (IF) signal by a frequency conversion Integrated Circuit (IC) 15, and then the IF signal is output. Frequencies in an unnecessary band are eliminated from the IF signal by an IF filter 16, and then a resulting signal is amplified by an IF amplifier 17. An amplified signal is demodulated by and output from a demodulation unit 18, and thus a user views a program in a desired channel.

In the tuner, Automatic Gain Control (AGC) may be classified into single AGC and double AGC. Single AGC may be configured such that the frequency conversion IC 15 adjusts the level of the IF signal input to the IF amplifier 17 while varying an amplification factor by controlling the RF amplifier 13 using an RF-AGC signal in response to the input RF signal, and such that the demodulation unit 18 adjusts the level of the IF signal while varying an amplification factor by controlling the IF amplifier 17 using an IF-AGC signal in response to the input IF signal. Further, double AGC may be configured such that the demodulation unit 18 adjusts the level of the IF signal input to the IF amplifier 17 while varying an amplification factor by respectively controlling the RF amplifier 13 and the IF amplifier 17 using an RF-AGC signal and an IF-AGC signal in response to the input IF signal.

In this case, in order to increase sensitivity to the IF signal input to the demodulation unit 18, the IF filter 16 is used upstream of the demodulation unit 18. The filter used for this is a band pass filter, for example, a Surface Acoustic Wave (SAW) filter which cuts off frequencies in an undesired band.

In this way, when two intermediate frequencies are used, the circuit of FIG. 2 may be used as the IF filter 16.

FIG. 2 is a circuit diagram showing a conventional IF filter implemented when two intermediate frequencies are used.

Referring to FIG. 2, the conventional IF filter implemented when two intermediate frequencies are used includes a resistor R1 connected between an input terminal In and an output terminal Out, which are connected to a frequency conversion IC, a capacitor C1 connected between the input terminal In and the output terminal Out, an inductor L1 connected between the input terminal In and a reference voltage input terminal, an inductor L2 connected between the output terminal and the reference voltage input terminal, and a capacitor C2 connected between the reference voltage input terminal and the ground.

In the above construction, the input terminal In and the output terminal Out may be switched and used as an output terminal and an input terminal, respectively. That is, in the basic concept, when the input terminal In receives an IF signal from the frequency conversion IC, the output terminal Out outputs an IF signal filtered by the IF filter. In addition to the basic concept, the output terminal Out may be used to function as an input terminal for receiving an IF signal from the frequency conversion IC, and the input terminal In may be used to function as an output terminal for outputting an IF signal filtered by the IF filter.

Since such a conventional IF filter was manufactured to emphasize the minimization of loss at one IF, it is difficult to satisfy loss characteristics among the pass characteristics of another IF.

For example, when one IF is 38.9 MHz, and the other IF is 10.7 MHz, excellent filtering characteristics are exhibited at an IF of 38.9 MHz, but it is difficult to overcome loss at an IF of 10.7 MHz, as shown in FIG. 3.

SUMMARY OF THE INVENTION

Accordingly, the present invention has been made keeping in mind the above problems occurring in the prior art, and the present invention is intended to provide an intermediate frequency filter having a variable pass band, which can obtain desired filtering characteristics according to the input intermediate frequency by varying the pass band of the IF filter when two intermediate frequencies are used.

In accordance with an aspect of the present invention, there is provided an Intermediate Frequency (IF) filter having a variable pass band, comprising a band pass filter unit arranged between a frequency conversion Integrated Circuit (IC) and a demodulation unit and configured to filter an IF signal output from the frequency conversion IC and output a resulting signal; a band varying unit connected to the band pass filter unit and configured to vary a pass band of the band pass filter unit; a switching unit configured to connect or disconnect the band varying unit to or from the band pass filter unit; and a control unit configured to detect the IF signal, output from the frequency conversion IC, and to control the switching unit in response to the detected IF signal so that the band varying unit is connected to or disconnected from the band pass filter unit.

Further, the band pass filter unit comprises a capacitive element; and the band varying unit is connected in parallel with the capacitive element of the band pass filter unit, and is configured to vary the pass band of the band pass filter unit by varying impedance of the band pass filter unit.

Further, the switching unit comprises a switch diode, an anode of which is connected to a first end of the capacitive element of the band pass filter unit and a cathode of which is connected to a capacitive element of the band varying unit; and a transistor, a collector of which is connected to a reference voltage input terminal through a first resistor of the switching unit and is connected to the anode of the switch diode through a second resistor of the switching unit, an emitter of which is grounded, and a base of which is connected to the control unit, and the transistor turns off the switch diode when a high signal is received from the control unit, and turns on the switch diode to enable the band varying unit to be connected to the band pass filter unit when a low signal is received from the control unit.

Further, the base of the transistor is connected to the control unit through a third resistor of the switching unit.

Further, the frequency conversion IC outputs any one of different types of IF signals.

Further, the frequency conversion IC outputs any one of different format IF signals of an identical type.

Further, the band pass filter unit comprises an input terminal connected to the frequency conversion IC; an output terminal connected to the frequency conversion IC; a first resistive element connected between the input terminal and the output terminal; a capacitive element connected between the input terminal and the output terminal; a first inductive element connected between the input terminal and the reference voltage input terminal; and a second inductive element connected between the output terminal and the reference voltage input terminal.

The IF filter further comprises a ripple-elimination capacitive element connected to the reference voltage input terminal of the band pass filter unit and configured to eliminate ripple components from a reference voltage.

Further, the band varying unit is connected in parallel with the capacitive element of the band pass filter unit and configured to vary the pass band by varying impedance of the band pass filter unit.

Further, the switching unit comprises a switch diode, an anode of which is connected to a first end of the capacitive element of the band pass filter unit and a cathode of which is connected to a capacitive element of the band varying unit; and a transistor, a collector of which is connected to a reference voltage input terminal through a first resistor of the switching unit and is connected to the anode of the switch diode through a second resistor of the switching unit, an emitter of which is grounded, and a base of which is connected to the control unit, and the transistor turns off the switch diode when a high signal is received from the control unit, and turns on the switch diode to enable the band varying unit to be connected to the band pass filter unit when a low signal is received from the control unit.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, an Intermediate Frequency (IF) filter having a variable pass band according to an embodiment of the present invention will be described with reference to the attached drawings.

Figure 1:
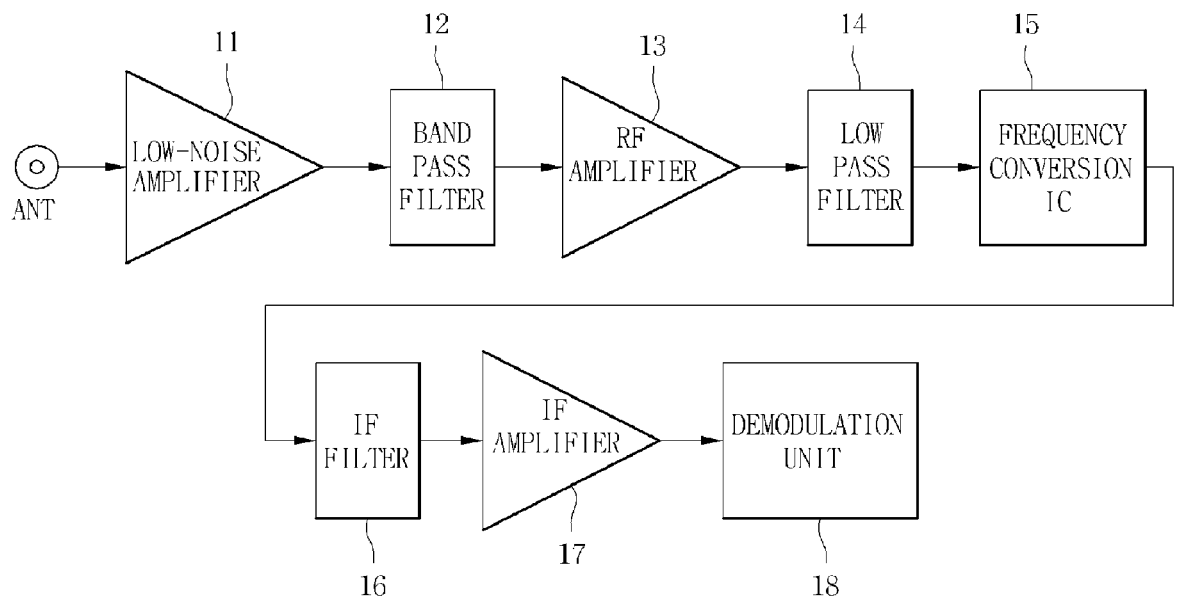
FIG. 1 is a diagram showing the construction of a conventional tuner.
Figure 2:
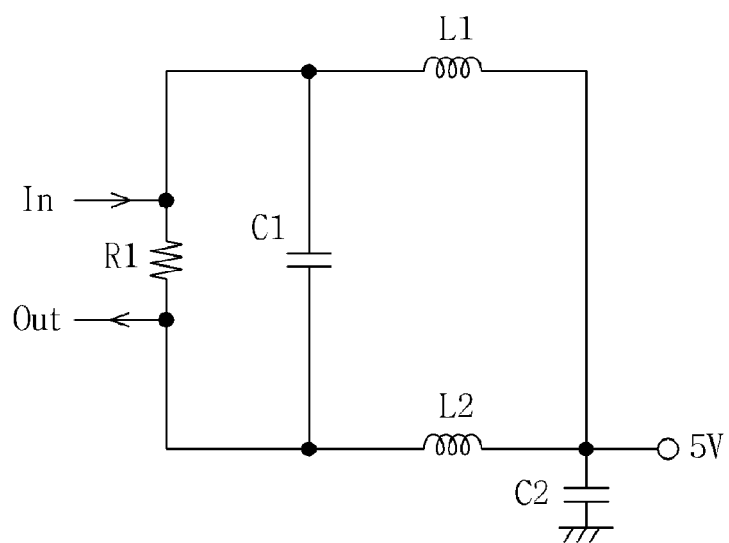
FIG. 2 is a circuit diagram showing an IF filter used in the conventional tuner.
Figure 3:
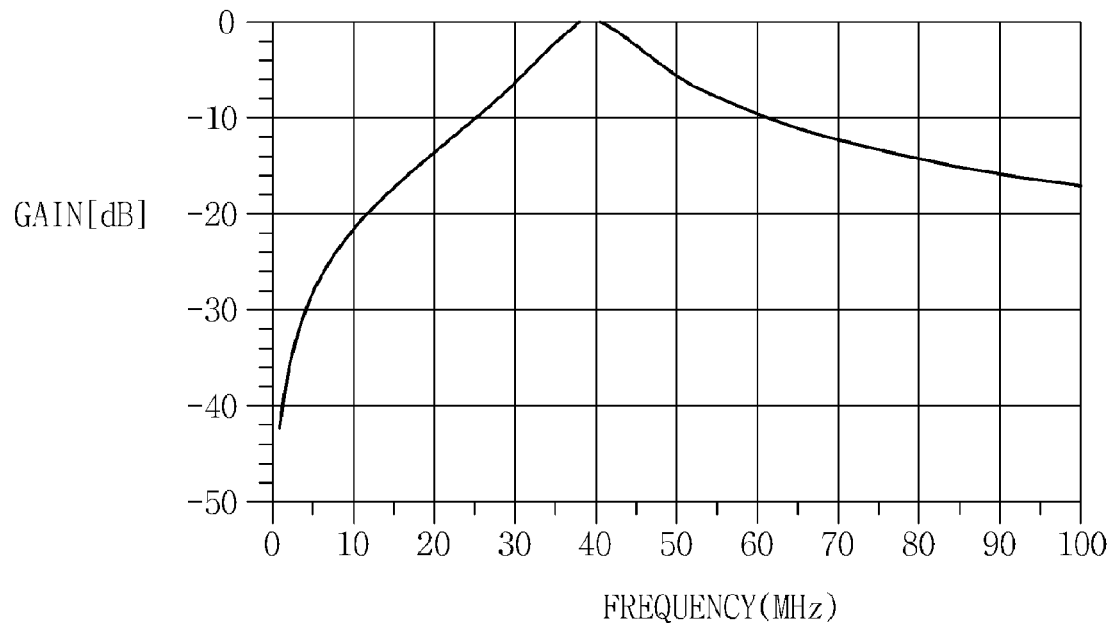
FIG. 3 is a graph showing the pass band characteristics of the conventional tuner.
Figure 4:
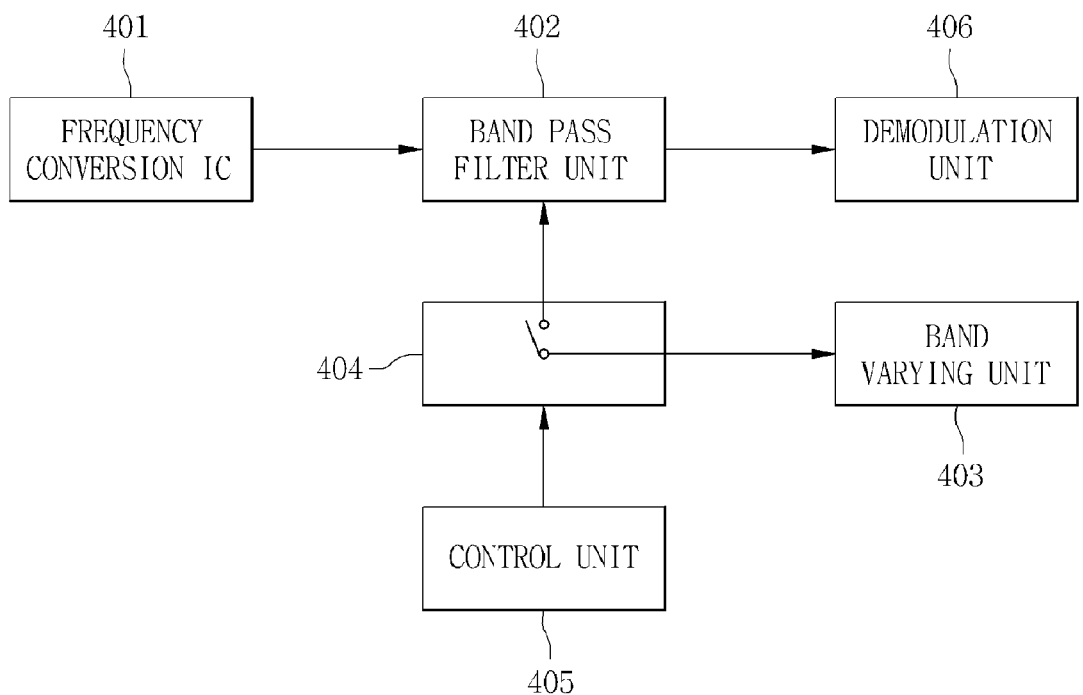
FIG. 4 is a diagram showing the construction of an IF filter having a variable pass band according to an embodiment of the present invention.

FIG. 4 is a diagram showing the construction of an IF filter having a variable pass band according to an embodiment of the present invention.

Referring to FIG. 4, the IF filter having a variable pass band according to an embodiment of the present invention includes a band pass filter unit 402, a band varying unit 403, a switching unit 404, and a control unit 405. The band pass filter unit 402 is arranged between a frequency conversion IC 401 and a demodulation unit 406 and configured to filter an IF signal output from the frequency conversion IC 401 and output a resulting signal. The band varying unit 403 is connected to the band pass filter unit 402 and configured to vary the pass band of the band pass filter unit 402. The switching unit 404 is configured to connect or disconnect the band varying unit 403 to or from the band pass filter unit 402. The control unit 405 detects an IF signal output from the frequency conversion IC 401 and controls the switching unit 404 in response to the detected IF signal, thus enabling the band varying unit 403 to be connected to or disconnected from the band pass filter unit 402.

In this case, the band pass filter unit 402 performs band pass filtering so that, when the band varying unit 403 is not connected thereto, loss at one of two intermediate frequencies can be minimized, and thereafter outputs a resulting IF signal to the demodulation unit 406.

Further, the band pass filter unit 402 performs band pass filtering so that, when the band varying unit 403 is connected thereto, the pass band of the band pass filter unit 402 varies and loss at the other of the two intermediate frequencies can be minimized, and thereafter outputs a resulting IF signal to the demodulation unit 406.

Next, the band varying unit 403 is implemented as a capacitive element such as a capacitor, or an inductive element such as an inductor, and is configured to vary the pass band of the band pass filter unit 402 by varying the impedance thereof when the band varying unit 403 is connected to the band pass filter unit 402.

Generally, the band of the band pass filter unit 402 is determined by the impedance of the capacitive element or inductive element constituting the band pass filter unit 402. When such impedance varies, the pass band of the band pass filter unit 402 also varies.

Therefore, when the band varying unit 403 implemented as the capacitive element or the inductive element is connected to the band pass filter unit 402, the impedance of the capacitive element or the inductive element varies, and thus the pass band of the band pass filter unit 402 also varies.

Meanwhile, the switching unit 404 performs a switching operation of connecting or disconnecting the band varying unit 403 to or from the band pass filter unit 402 under the control of the control unit 405, and enables the pass band of the band pass filter unit 402 to be varied by the switching operation.

Further, the control unit 405 controls the switching unit 404 so that the band varying unit 403 is connected to or disconnected from the band pass filter unit 402.

For this operation, the control unit 405 detects the IF signal output from the frequency conversion IC 401, and controls the switching unit 404 such that, when the detected IF signal is an IF signal, appropriate for being filtered by the band pass filter unit 402 in the state in which the band varying unit 403 is not connected to the band pass filter unit 402, the band varying unit 403 is disconnected from the band pass filter unit 402.

In contrast, the control unit 405 controls the switching unit 404 such that, when the IF signal detected by and output from the frequency conversion IC 401 is an IF signal, appropriate for being filtered by the band pass filter unit 402 in the state in which the band varying unit 403 is connected to the band pass filter unit 402, the band varying unit 403 is connected to the band pass filter unit 402.

The operation of the IF filter having a variable pass band, constructed as described above, will be described below.

First, the frequency conversion IC 401 outputs any one of two IF signals.

In an embodiment, the output IF signal may include two types of reception signals, that is, a first type reception signal (for example, TV signals) and a second type reception signal (for example, FM radio signals). An IF signal corresponding to any one of the two types of signals may be output.

In another embodiment, the output IF signal may include different format signals of the same type (for example, in the case of TV signals, different format signals such as National Television System Committee [NTSC], Phase Alternating Line [PAL], and Sequential Couleur Avec Memoire [SECAM] signals). An IF signal corresponding to any one of these format signals may be output.

Then, the control unit 405 determines which reception signal corresponds to the IF signal output from the frequency conversion IC 401, and allows the IF signal to pass through the band pass filter unit 402 when the IF signal is determined to be an IF signal that can be processed by the band pass filter unit 402 in the state in which the band varying unit 403 is not connected to the band pass filter unit 402.

In contrast, when the IF signal output from the frequency conversion IC 401 is determined not to be an IF signal appropriate for being processed by the band pass filter unit 402 in the state in which the band varying unit 403 is not connected to the band pass filter unit 402, the control unit 405 controls the switching unit 404 such that the band varying unit 403 is connected to the band pass filter unit 402.

When the band varying unit 403 is connected to the band pass filter unit 402 through the switching operation of the switching unit 404 in this way, the impedance of the band pass filter unit 402 varies, and thus the pass band of the band pass filter unit varies.

Furthermore, when the pass band of the band pass filter unit 402 varies in this way, the band pass filter unit 402 exhibits excellent characteristics for the IF signals output from the frequency conversion IC 401.

Figure 5:
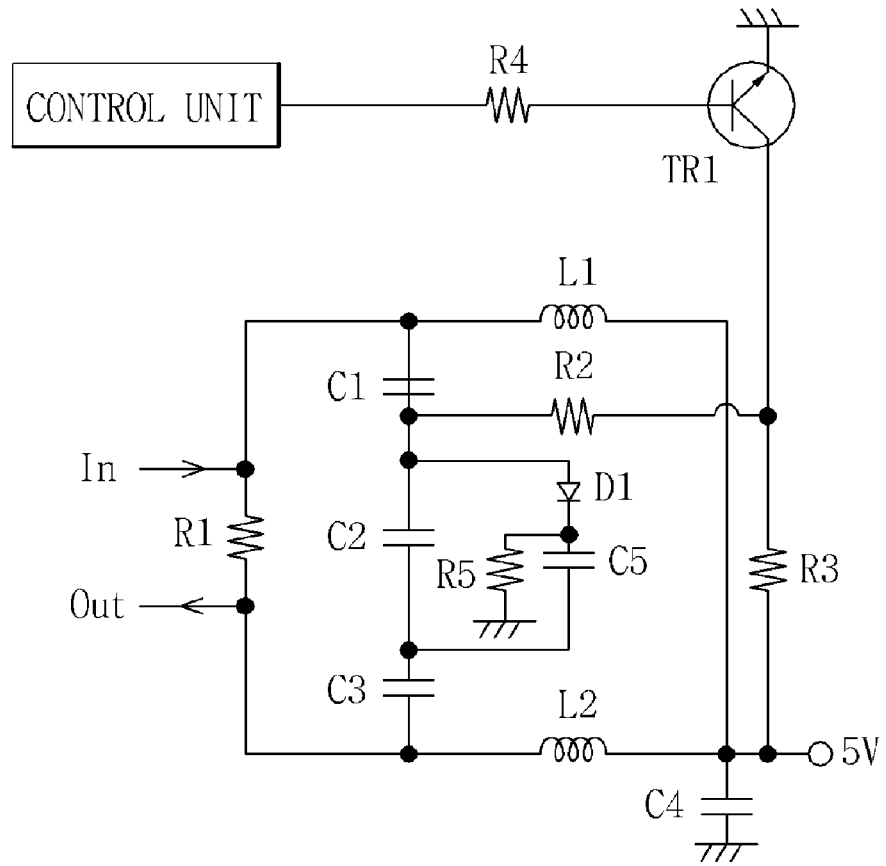
FIG. 5 is a circuit diagram showing an IF filter having a variable pass band according to an embodiment of the present invention.

FIG. 5 is a circuit diagram showing an IF filter having a variable pass band according to an embodiment of the present invention.

Referring to FIG. 5, the IF filter having a variable pass band according to an embodiment of the present invention includes an input terminal In and an output terminal Out which are connected to the frequency conversion IC, a resistor R1 connected between the input terminal In and the output terminal Out, a series-connection structure of capacitors C1 to C3 connected between the input terminal In and the output terminal Out, an inductor L1 connected between the input terminal In and a reference voltage input terminal, an inductor L2 connected between the output terminal Out and the reference voltage input terminal, and a capacitor C4 connected between the reference voltage input terminal and the ground.

Further, the IF filter having a variable pass band according to an embodiment of the present invention includes a transistor TR1, the base of which is connected to the control unit, the collector of which is connected to the reference voltage input terminal, and the emitter of which is grounded, and a switch diode D1, the anode of which is connected to one end of the capacitor C2.

Furthermore, the IF filter having a variable pass band according to the present invention includes a capacitor C5 connected between the cathode of the switch diode D1 and the other end of the capacitor C2, a resistor R2 connected between the anode of the switch diode D1 and the collector of the transistor TR1, and a resistor R3 connected between the reference voltage input terminal and the collector of the transistor TR1.

Furthermore, the IF filter having a variable pass band according to the present invention includes a resistor R4 connected between the control unit and the base of the transistor TR1, and a resistor R5 connected between the cathode of the switch diode D1 and the ground.

In the above construction, the input terminal and the output terminal may be switched and used as the output terminal and the input terminal, respectively. That is, in the basic concept, when the input terminal In receives an IF signal from the frequency conversion IC, the output terminal Out outputs a resulting IF signal filtered by the IF filter. In addition to the basic concept, the output terminal Out/input terminal In may be used such that the output terminal Out functions as an input terminal for receiving an IF signal from the frequency conversion IC, and the input terminal In functions as an output terminal for outputting a resulting IF signal filtered by the IF filter.

Meanwhile, in the IF filter having a variable pass band of FIG. 5, the resistor R1, the series-connection structure of the capacitors C1 to C3, and the inductors L1 to L2 constitute the band pass filter unit.

Further, the transistor TR1, the switch diode D1, the resistor R2 and the resistor R3 constitute a switching unit, and the capacitor C5 constitutes the band varying unit.

Next, the operation of the IF filter having a variable pass band according to an embodiment of the present invention will be described in detail.

First, the control unit detects an input IF signal when the input IF signal is received from the frequency conversion IC, and then determines whether to turn on or off the transistor.

In this case, when an IF signal appropriate for being processed by the band pass filter unit without the connection of the band varying unit is received, the control unit turns on the transistor TR1 by supplying a high signal to the transistor TR1.

When the transistor TR1 is turned on in this way, a voltage almost identical to that of the ground is applied to the collector of the transistor TR1 because the emitter of the transistor TR1 is grounded. As a result, a negative voltage is applied to a connection node between the resistor R2 and the switch diode D1.

When the negative voltage is applied to the anode of the switch diode D1 in this way, the switch diode D1 is maintained in an OFF state, so that the capacitor C5 is disconnected from the capacitor C2, and thus the band pass filter unit composed of the resistor R1, the series-connection structure of the capacitors C1 to C3, and the inductors L1 and L2 does not have variation in impedance, and performs filtering to allow the input IF signal to pass through the band pass filter unit.

Meanwhile, when an IF signal inappropriate for being processing by the band pass filter unit is received, the control unit turns off the transistor TR1 by supplying a low signal to the base of the transistor TR1.

When the transistor TR1 is turned off in this way, current does not flow through the transistor TR1, and a reference voltage of 5V applied to the reference voltage input terminal is moved along a path of the resistor R3 and the resistor R2, and thus a voltage almost identical to 5V is applied to the connection node between the resistor R2 and the switch diode D1.

When this voltage almost similar to 5V is applied to the anode of the switch diode D1, the diode D1 is turned on, and thus the capacitor C5 is connected in parallel with the capacitor C2.

As a result, the impedance of the series-connection structure of the capacitors C1 to C3 varies through the connection with the capacitor C5.

When the voltage almost similar to the reference voltage applied to the reference voltage input terminal is applied to the anode of the switch diode D1, the switch diode D1 is maintained in an ON state. Accordingly, the capacitor C5 and the capacitor C2 are connected to each other, so that the impedance varies. As a result, the band pass filter unit composed of the resistor R1, the series-connection structure of the capacitors C1 to C3, and the inductors L1 and L2 performs filtering to allow the other input IF signal to pass therethrough so that the pass band of the band pass filter unit varies due to the variation in the impedance.

Meanwhile, the capacitor C4 of the circuit of FIG. 5 is a ripple-elimination capacitor which is connected to the reference voltage input terminal and is configured to eliminate ripple components from the input reference voltage.

Further, the resistor R5 is a bypass resistor for bypassing the current input to the capacitor C5 in the case where the switch diode D1 is turned off.

When the pass band of the IF filter according to the present invention varies in this way, loss can be minimized when an IF varies.

Figure 6A:
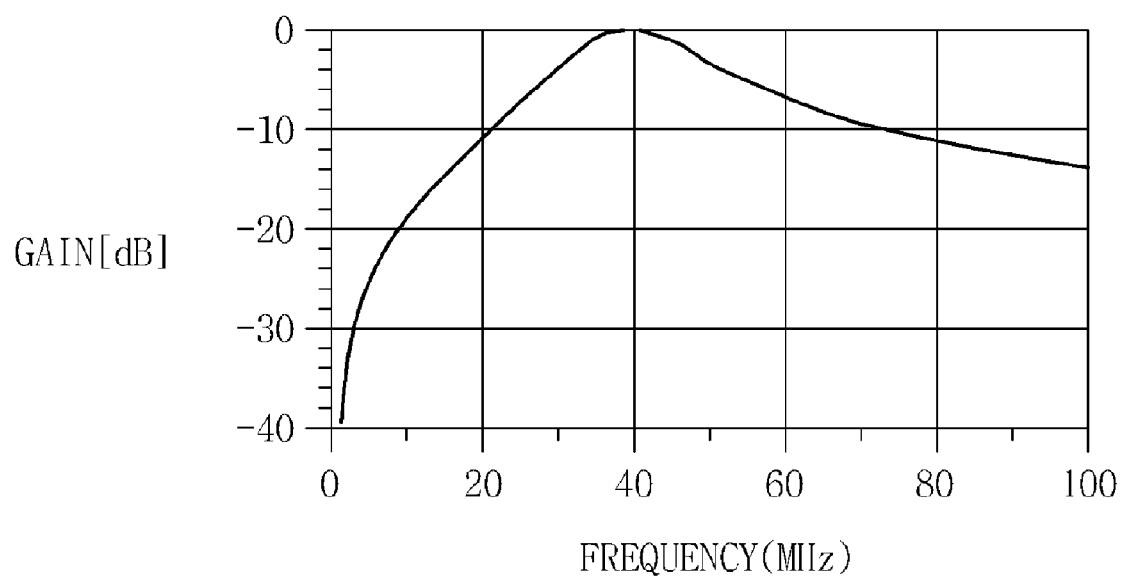
FIG. 6A is a graph showing the pass band characteristics of the IF filter at a first IF and FIG. 6B is a graph showing the pass band characteristics of the IF filter at a second IF according to the present invention.
Figure 6B:
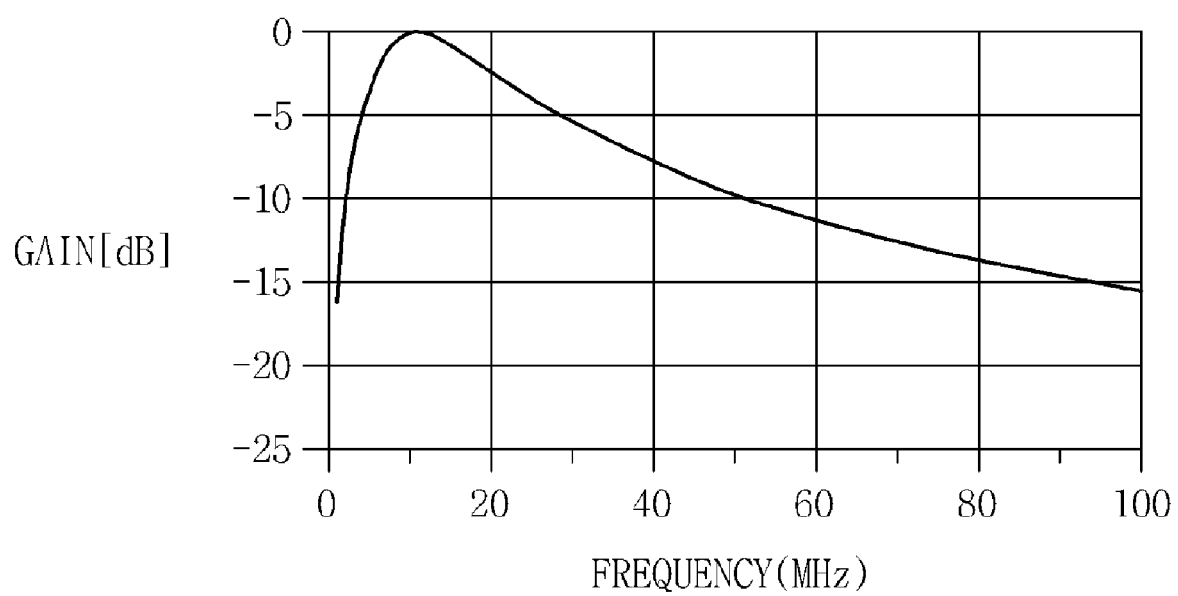

FIGS. 6A and 6B are graphs showing the frequency characteristics of an IF filter having a variable pass band according to an embodiment of the present invention.

As shown in FIG. 6A, when filtering is performed on a first IF signal (for example, 38.9 MHz) by using a band pass filter unit designed to be appropriate for the first IF signal, excellent frequency characteristics can be obtained.

Further, in the case where a second IF signal (for example, 10. MHz) is received, when the pass band of the band pass filter unit is intended to vary by connecting the band varying unit to the band pass filter unit, the pass band of the band pass filter unit varies, as shown in FIG. 6B, and thus excellent frequency characteristics can be obtained at the second IF signal.

Meanwhile, in the embodiment of the present invention, the case where two different IF signals are received has been described. However, even if more than two IF signals are received, a plurality of band varying units may be provided and controlled such that desired filtering characteristics are obtained at respective IF signals by connecting band varying units appropriate for the respective IF signals to the band pass filter unit.

As described above, the present invention is advantageous in that desired filtering characteristics can be obtained according to the input IF by varying the pass band of an IF filter. That is, according to the present invention, there is an advantage in that the pass band of the IF filter varies according to the input IF, thus minimizing loss at two intermediate frequencies.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An Intermediate Frequency (IF) filter having a variable pass band, comprising:
    a band pass filter unit arranged between a frequency conversion Integrated Circuit (IC) and a demodulation unit and configured to filter an IF signal output from the frequency conversion IC and output a resulting signal;
    a band varying unit connected to the band pass filter unit and configured to vary a pass band of the band pass filter unit;
    a switching unit configured to connect or disconnect the band varying unit to or from the band pass filter unit; and
    a control unit configured to detect the IF signal, output from the frequency conversion IC, and to control the switching unit in response to the detected IF signal so that the band varying unit is connected to or disconnected from the band pass filter unit.

2. The IF filter as set forth in claim 1, wherein:
    the band pass filter unit comprises a capacitive element; and
    the band varying unit is connected in parallel with the capacitive element of the band pass filter unit, and is configured to vary the pass band of the band pass filter unit by varying impedance of the band pass filter unit.

3. The IF filter as set forth in claim 2, wherein:
    the switching unit comprises:
    a switch diode, an anode of which is connected to a first end of the capacitive element of the band pass filter unit and a cathode of which is connected to a capacitive element of the band varying unit; and
    a transistor, a collector of which is connected to a reference voltage input terminal through a first resistor of the switching unit and is connected to the anode of the switch diode through a second resistor of the switching unit, an emitter of which is grounded, and a base of which is connected to the control unit, and
    the transistor turns off the switch diode when a high signal is received from the control unit, and turns on the switch diode to enable the band varying unit to be connected to the band pass filter unit when a low signal is received from the control unit.

4. The IF filter as set forth in claim 3, wherein the base of the transistor is connected to the control unit through a third resistor of the switching unit.

5. The IF filter as set forth in claim 1, wherein the band pass filter unit comprises:
    an input terminal connected to the frequency conversion IC;
    an output terminal connected to the frequency conversion IC;
    a first resistive element connected between the input terminal and the output terminal;
    a capacitive element connected between the input terminal and the output terminal;
    a first inductive element connected between the input terminal and a reference voltage input terminal; and a second inductive element connected between the output terminal and the reference voltage input terminal.

6. The IF filter as set forth in claim 5, further comprising a ripple-elimination capacitive element connected to the reference voltage input terminal of the band pass filter unit and configured to eliminate ripple components from a reference voltage.

7. The IF filter as set forth in claim 5, wherein the band varying unit is connected in parallel with the capacitive element of the band pass filter unit and configured to vary the pass band by varying impedance of the band pass filter unit.

8. The IF filter as set forth in claim 7, wherein:
the switching unit comprises:
a switch diode, an anode of which is connected to a first end of the capacitive element of the band pass filter unit and a cathode of which is connected to a capacitive element of the band varying unit; and
a transistor, a collector of which is connected to the reference voltage input terminal through a first resistor of the switching unit and is connected to the anode of the switch diode through a second resistor of the switching unit, an emitter of which is grounded, and a base of which is connected to the control unit, and
the transistor turns off the switch diode when a high signal is received from the control unit, and turns on the switch diode to enable the band varying unit to be connected to the band pass filter unit when a low signal is received from the control unit.

* * * * *